(12) United States Patent
Murphy et al.

(10) Patent No.: US 6,312,872 B1
(45) Date of Patent: *Nov. 6, 2001

(54) COMPOSITE RELIEF IMAGE PRINTING PLATES

(75) Inventors: Edward Murphy, Douglasville; David Recchia, Smyrna; Daniel Rosen, Acworth, all of GA (US)

(73) Assignee: MacDermid Graphic Arts, Atlanta, GA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/417,043

(22) Filed: Oct. 12, 1999

Related U.S. Application Data

(63) Continuation-in-part of application No. 08/957,165, filed on Oct. 24, 1997.

(51) Int. Cl.⁷ .................................................. G03F 7/26
(52) U.S. Cl. ...................... 430/306; 430/22; 430/300; 430/273.1
(58) Field of Search .................. 430/273.1, 306, 430/300, 22

(56) References Cited

U.S. PATENT DOCUMENTS

| | | | |
|---|---|---|---|
| 1,736,914 | 11/1929 | Huebner | 430/300 |
| 2,111,914 | 3/1938 | Kohlberger | 430/22 |
| 3,265,765 | 8/1966 | Holden et al. | 260/876 |

(List continued on next page.)

FOREIGN PATENT DOCUMENTS

| | | |
|---|---|---|
| 41 17 127 A1 | 11/1992 | (DE) . |
| 0 456 336 A2 | 11/1991 | (EP) . |
| 0 465 949 A2 | 1/1992 | (EP) . |

(List continued on next page.)

OTHER PUBLICATIONS

World Patents Index AN92–399940 Derwent Information, Ltd., English abstract of DE 41 17 127 A1 (Bauer), Nov. 26, 1992.
World Patents Index AN93–317716 Derwent Information, Ltd., English abstract of JP 05–230408 A2 (Seiko Epson Corp.), Sep. 7, 1993.
World Patents Index AN96–445569 Derwent Information, Ltd., English abstract of JP 63–109052 (Cannon KK), May 13, 1988.
World Patents Index AN92–017597, Derwent Information, Ltd., English abstract of EP 0 465 949A2 (Bauer et al.).
109:160645 from Chemical Abstracts, American Chemical Society, English Abstract of JP 63–109052 (Horiike et al.).
117:101041 from Chemical Abstracts, American Chemical Society, English Abstract of EP 0 465 949A2 (Bauer et al.).
118:157929 from Chemical Abstracts, American Chemical Society, English Abstract of DE 41 17 127 A1 (Bauer), Nov. 6, 1992.
119:273625 from Chemical Abstracts Online, American Chemical Society, English Abstract of JP 05–230408 A2 (Yanase et al.), Sep. 7, 1993, See IT 131–55–5, Uvinul D 50.
RN 131–55–5 of Registry Online, American Chemical Society, 1997.
63–109052, Patent Abstracts of Japan, 12(347), Sep. 19, 1988, English abstract of JP 63–109052 (Horiike et al.).

Primary Examiner—Cynthia Hamilton
(74) Attorney, Agent, or Firm—Woodcock Washburn Kurtz Mackiewicz & Norris LLP

(57) ABSTRACT

High-quality composite printing elements are prepared without the need for precise registration of constituent photocurable elements by disposing at least one photocurable element, and preferably a plurality of photocurable elements, upon a surface of a printing element in approximate register and then transferring a computer-generated negative onto a surface of the elements.

29 Claims, 13 Drawing Sheets

U.S. PATENT DOCUMENTS

| | | | |
|---|---|---|---|
| 3,867,153 | 2/1975 | MacLachlan | 96/79 |
| 4,132,168 * | 1/1979 | Peterson | 101/471 |
| 4,211,834 | 7/1980 | Lapadula et al. | 430/326 |
| 4,264,705 | 4/1981 | Allen | 430/271 |
| 4,265,986 | 5/1981 | Allen et al. | 430/18 |
| 4,320,188 | 3/1982 | Heinz et al. | 430/281 |
| 4,323,636 | 4/1982 | Chen | 430/271 |
| 4,323,637 | 4/1982 | Chen et al. | 430/271 |
| 4,369,246 | 1/1983 | Chen et al. | 430/306 |
| 4,410,562 | 10/1983 | Nemoto et al. | 427/54.1 |
| 4,423,135 | 12/1983 | Chen et al. | 430/271.1 |
| 4,427,759 | 1/1984 | Gruetzmacher et al. | 430/273.1 |
| 4,429,027 | 1/1984 | Chambers, Jr. et al. | 430/5 |
| 4,460,675 | 7/1984 | Gruetzmacher et al. | 430/300 |
| 4,622,088 | 11/1986 | Min | 156/244.11 |
| 4,785,733 | 11/1988 | Hartung et al. | 101/181 |
| 4,927,740 | 5/1990 | Wallbillich et al. | 430/309 |
| 5,135,827 | 8/1992 | Bohm et al. | 430/30 |
| 5,223,375 | 6/1993 | Berrier et al. | 430/281.1 |
| 5,262,275 * | 11/1993 | Fan | 430/273.1 |
| 5,439,328 | 8/1995 | Haggerty et al. | 408/1 R |
| 5,495,803 | 3/1996 | Gerber et al. | 430/306 |
| 5,506,086 | 4/1996 | Van Zoeren | 430/201 |
| 5,562,039 | 10/1996 | Fox et al. | 101/486 |
| 5,752,445 | 5/1998 | Ruggiero et al. | 101/486 |
| 5,846,691 * | 12/1998 | Cusdin et al. | 430/300 |
| 5,925,500 | 7/1999 | Yang et al. | 430/300 |

FOREIGN PATENT DOCUMENTS

| | | |
|---|---|---|
| 0 503 621 A1 | 9/1992 | (EP) . |
| 0 568 841 A1 | 11/1992 | (EP) . |
| 0 640 878 A1 | 3/1995 | (EP) . |
| 0 741 335 A1 | 12/1996 | (EP) . |
| 0 776 763 A1 | 6/1997 | (EP) . |
| 1366769 | 9/1974 | (GB) . |
| 2281250 | 3/1995 | (GB) . |
| 2281250 A | 3/1995 | (GB) . |
| 55157737 | 12/1980 | (JP) . |
| 58-48055A | 3/1983 | (JP) . |
| 63-109052 | 5/1988 | (JP) . |
| 05-230408 A2 | 9/1993 | (JP) . |
| 5-230408 | 9/1993 | (JP) . |
| 6-11840 | 1/1994 | (JP) . |
| 6-222572 | 8/1994 | (JP) . |
| 6-250372 | 9/1994 | (JP) . |
| 07219236 | 8/1995 | (JP) . |
| 92/02859 * | 2/1992 | (WO) . |
| WO 92/02859 | 2/1992 | (WO) . |
| 97/25206 | 7/1997 | (WO) . |
| 98/01792 | 1/1998 | (WO) . |

* cited by examiner

COMPOSITE RELIEF IMAGE PRINTING PLATES

RELATED APPLICATION

This patent application is a continuation-in-part of U.S. patent application Ser. No. 08/957,165, filed Oct. 24, 1997, now abandoned, which is incorporated herein by reference.

FIELD OF THE INVENTION

The present invention is directed to the preparation of composite printing elements and, more particularly, to the direct transfer of digital images to such composites without the use of phototools.

BACKGROUND OF THE INVENTION

Relief image printing plates are used in both flexographic and letterpress processes for printing on a variety of substrates, including paper, corrugated stock, film, foil, and laminates. The photocurable elements that are used to make relief plates typically include a support layer and one or more layers of photocurable polymer in the form of solid sheets. The printer typically peels a cover sheet from the element to expose the photocurable polymer and places a silver halide photographic negative or some other masking device upon the photopolymer. The negative-bearing photocurable element then is exposed to ultraviolet (UV) light through the negative, thereby causing exposed areas of the element to harden, or cure. After the uncured areas of the element are removed, cured polymer remains as the relief printing surface.

Corrugated boxes and other, relatively large objects such as, for example, flexible packaging materials are typically printed using relief image printing plates that bear actual printing on only a small portion of their total surface area. One way to print such an object is to prepare a single relief image plate having a surface area corresponding to the total surface area of the object. Since only a portion of the object's surface needs to be printed, however, only a portion of the relief image plate will actually be used for ink transfer. The remainder of the plate will be unused and, essentially, wasted.

To minimize such waste, those skilled in the art often print relatively large objects with composite printing elements that are prepared by mounting a plurality of relief image printing elements on a common printing cylinder, sleeve, or carrier sheet. The individual elements, however, are mounted only on those portions of the carrier that correspond to the portions of the object that actually need to be printed. Although such composite elements do minimize waste, the current system for mounting their constituent relief image elements is laborious and requires careful adhesion of the elements to the carrier while assuring registration to within 0.005 inches on-press for high quality printing and multi-color reproduction. For multi-color reproduction, wherein a single element is used for printing each of the individual colors, accurate registration of the plates with respect to one another is crucial.

When a flexographic photopolymer printing element is mounted on a printing cylinder the printing surface of flexographic photopolymer printing element is stretched more than the back surface, i.e., the surface closest to the cylinder. This elongation of the printing surface typically causes distortion of the printed copy unless the elongation is compensated for during the manufacturing of the printing element. To compensate for the elongation of the printing surface, the printer must perform a tedious process of determining the precise percentage reduction of the negative image on the printing element so that, when mounted and stretched, a true image can be printed. The success of this process depends upon the printer's calculation of two factors that effect the image elongation—the thickness of the photopolymer layer above the neutral axis and the circumference of the plate cylinder (including the thickness of the adhesive or other material used to mount the element to the cylinder. Inaccurate measurements can result in a distorted image.

Consequently, there remains a need in the art for alternative processes for preparing composite printing elements. In particular, there remains a need for alternative processes for accurate registration of the constituent relief image printing elements on arcuate surfaces without the risk of image elongation.

BRIEF DESCRIPTION OF THE INVENTION

The present invention provides methods for preparing composite printing elements without the need for individual registration of constituent relief image elements and, preferably, without the need for compensating for image elongation due to cylindrical mounting. These methods comprise the steps of transferring registration information to an outer face of a printing element, disposing a photocurable element upon the surface of the printing element in approximate register, and then transferring a computer-generated negative image onto the photocurable element. In preferred embodiments, the printing element has a substantially arcuate cross-section.

Approximate registration of the photocurable elements can be achieved by transferring computer-generated registration information to a surface of the printing element. This can be achieved, for example, by transferring some visually perceptible material (such as ink from an ink jet print head) onto the printing element, or by scoring or otherwise deforming the element. The registration information can, for example, comprise a series of images whose respective shapes correspond to the outlines of the individual photocurable elements.

In one preferred embodiment of the present invention, transfer of the computer-generated negative image to composite elements of the invention preferably is achieved by ejecting a negative-forming ink from an ink jet print head. The ink preferably is substantially opaque to actinic radiation in at least one wavelength region effective to cure photocurable material within the element and substantially resistant to polymerization upon exposure to actinic radiation in the wavelength region. Following the negative transfer step, the ink-bearing element can be exposed to actinic radiation in the wavelength region for a time and under conditions effective to cure exposed areas of the photocurable material, and unexposed (i.e., uncured) areas then are removed to provide the relief printing surface.

In another preferred embodiment, transfer of the computer-generated negative image to composite elements of the invention is achieved by using a laser to ablate a photoablative mask layer on the photocurable elements' respective surfaces. The laser is employed to selectively ablate, or remove, the photoablative mask layer such that the areas where the photoablative mask layer is ablated will cure, or harden, upon exposure to the UV light and the areas where the photoablative mask layer is not ablated will remain uncured. Following front exposure of the exposed areas of the photopolymer, uncured photopolymer, i.e., the photopolymer under the areas of the photoablative layer that are not laser-ablated, is removed from the mounted photocurable elements.

BRIEF DESCRIPTION OF THE DRAWINGS

The numerous objects and advantages of the present invention may be better understood by those skilled in the art by reference to the accompanying non-scale figures, in which.

DETAILED DESCRIPTION OF THE INVENTION

The present invention provides methods that eliminate the tedious requirement of having to hand-register individual relief printing elements in preparing high-quality composite printing elements. In the methods of the invention, photocurable elements of the appropriate sizes required (or of sizes slightly greater than the sizes required) are mounted on a printing element in approximate register with the areas ultimately to be printed. Precise "registration" of the photocurable elements then is achieved by application of a computer-generated negative image to the composite element.

Composite printing elements according to the invention preferably are prepared by first transferring computer-generated registration information to one side of a suitable printing element. In one embodiment of the present invention, the suitable printing element is a substantially planar carrier sheet (i.e., one having two substantially flat opposing major faces) and can be formed from a transparent or opaque material such as paper, cellulose film, plastic, or metal. In preferred embodiments, the carrier sheet is a polyethylene terephthalate film having a thickness on the order of about 0.004–0.050 inches.

In another embodiment, the suitable printing element is substantially arcuate, such as, for example, a cylinder, and can be formed from various metals and/or resins (including fiber-reenforced resins) well-known to those skilled in the art. Suitable cylindrical printing elements are, for example, printing cylinders such as, for example, the Steel Flexo print cylinder, commercially available from RotoMetrics International (Eureka, Mo.), and printing sleeves commercially available from Axcyl, Inc. (Vancouver, Wash.).

Figure 6:
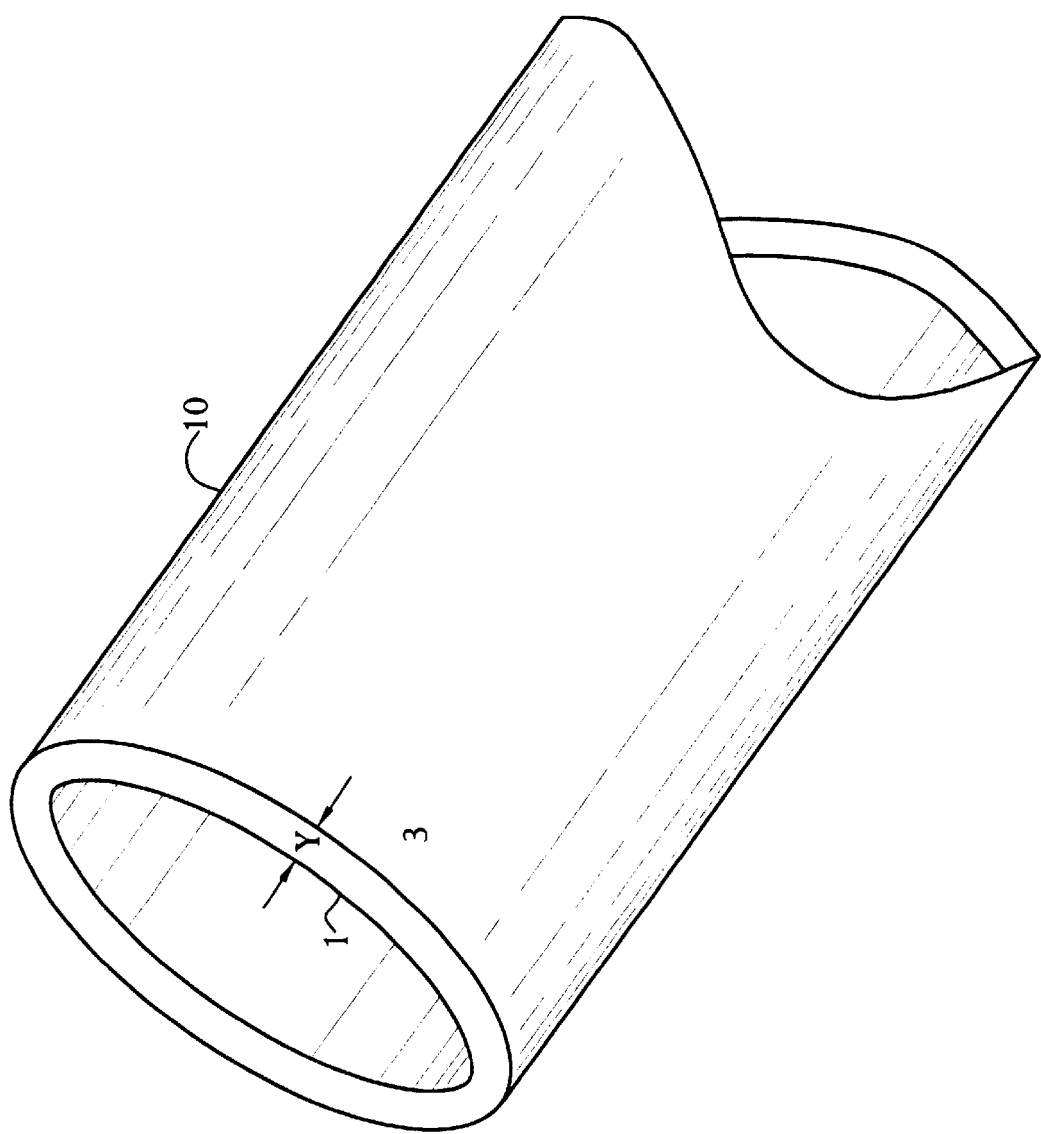
FIG. 6 is an angular cross-sectional view of another embodiment of a printing element according to the present invention.

A representative substantially arcuate printing element 10 is shown in FIG. 6 as a cylindrical printing element having an inner surface 1 as well as an outer surface 3. The total surface area of the inner surface 1 is less than the surface area of the outer surface 3. Y, the distance between the inner surface 1 and the outer surface 3, typically is on the order of about 0.002 to about 3.0 inches. Preferred substantially arcuate printing elements for use in the present invention are printing sleeves, such as, for example, AXCYL VERSAFLEX and AXCYL ELIMINATOR printing sleeves, commercially available from Axcyl, Inc. (Vancouver, Wash.). Such printing sleeves do not contain nips, or mechanical lock-up devices, and typically slide onto a mandrel (not shown) for the registration and printing operations.

The step of transferring registration information in accordance with the present invention includes any visually perceptible modification of the printing element intended to reflect positioning of photocurable elements thereon. Registration information can be transferred, for example, by disposing a visually perceptible material on the surface of the printing element. Representative materials include the various inks, dyes, and pigments which are known in the art which are perceptible by the human eye and/or can be rendered perceptible, such as through exposure to light of a selected wavelength (e.g., as with fluorescent dyes) and/or contact with chemical reactants (e.g. as with diazo dyes). These materials can be disposed using conventional means such as ink jet and bubble jet printers and pen and ink plotters. Registration information also can be transferred to the printing element in the absence of a transfer of a visually perceptible material by modifying the printing element in some visually perceptible manner. One can, for example, "score" the printing element by creating some deformation therein using, for example, a knife, razor blade, or some other suitable means for application of pressure. One also can shine light on the printing element using, for example, a laser. Additionally, one can project registration information on the printing element using, for example, a transparency, a slide or a digital LCD projector.

Figure 1:
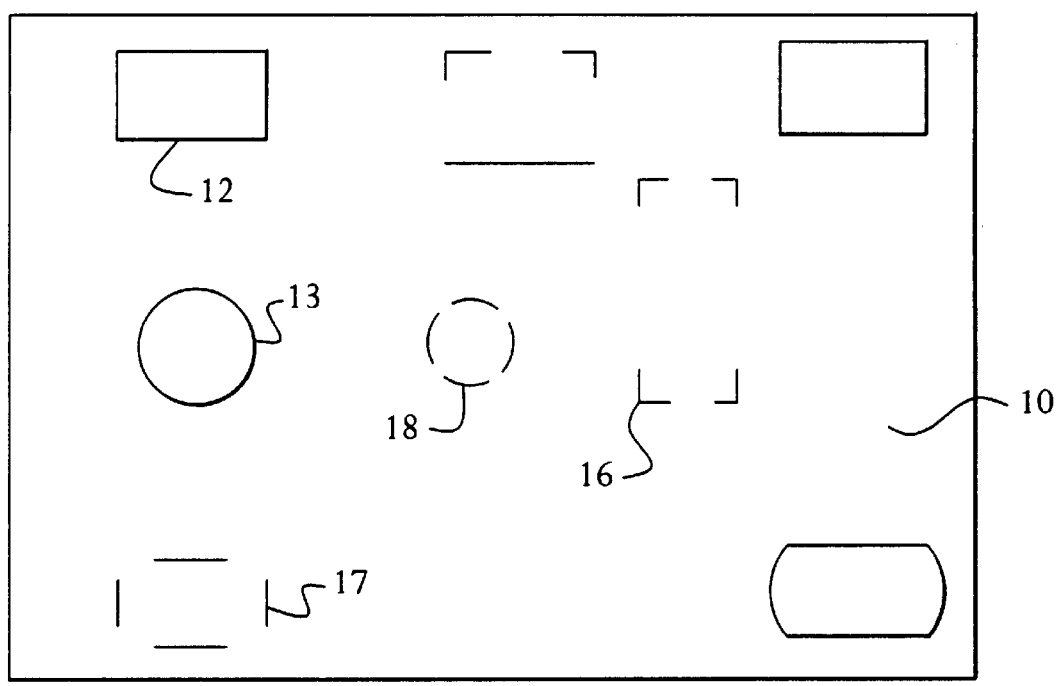
FIG. 1 is a top view of a printing element bearing registration information.
Figure 8:
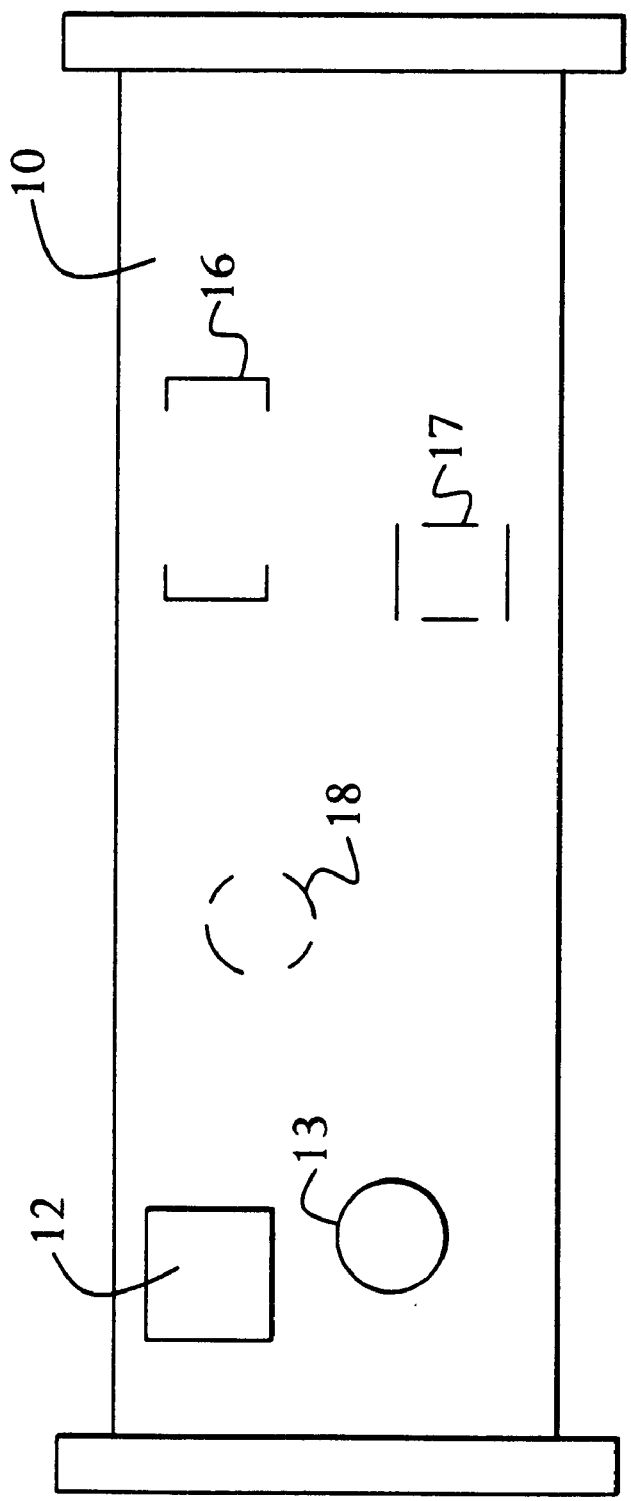
FIG. 8 is a side view of a substantially cylindrical printing element bearing registration information.

As shown in FIGS. 1 and 8, illustrating a substantially planar printing element and a substantially arcuate printing element, respectively, the registration information transferred to printing element 10 can include complete outlines (e.g. 12, 13) of the photocurable elements to be mounted, incomplete outlines corresponding, for example, to the corners, sides, or arcs of the photocurable elements (see, 16, 17, and 18 respectively), or any other suitable marking that is used to direct placement of the element during the mounting process.

Figure 2:
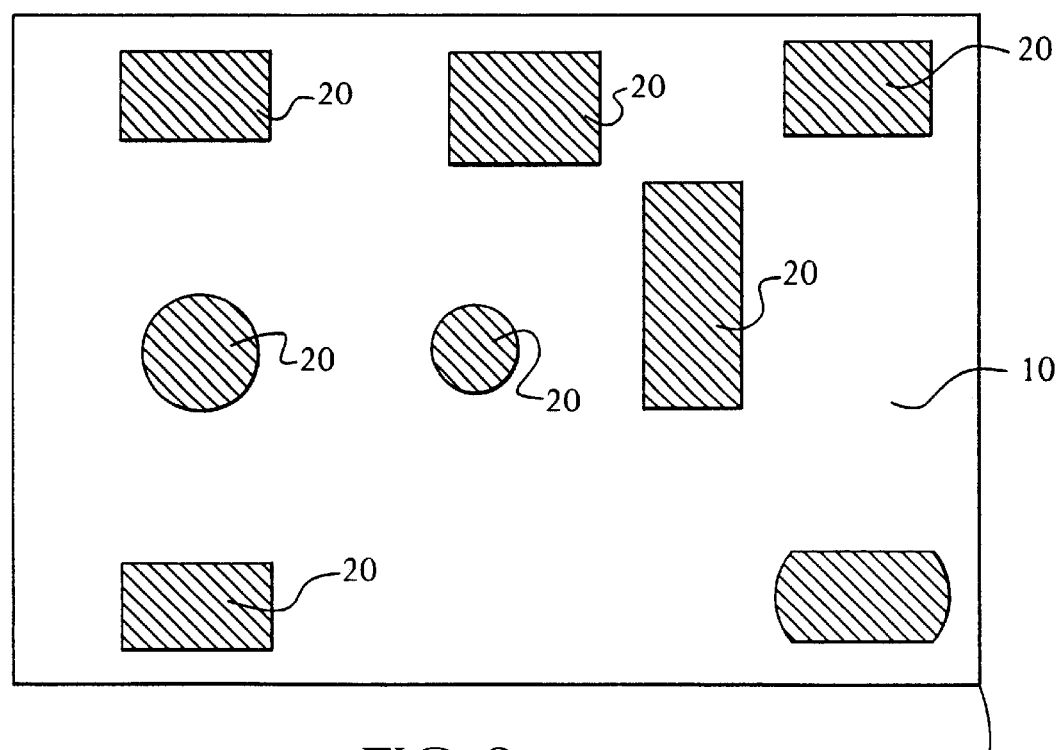
FIG. 2 is a top view of a composite printing elements according to the invention.
Figure 9:
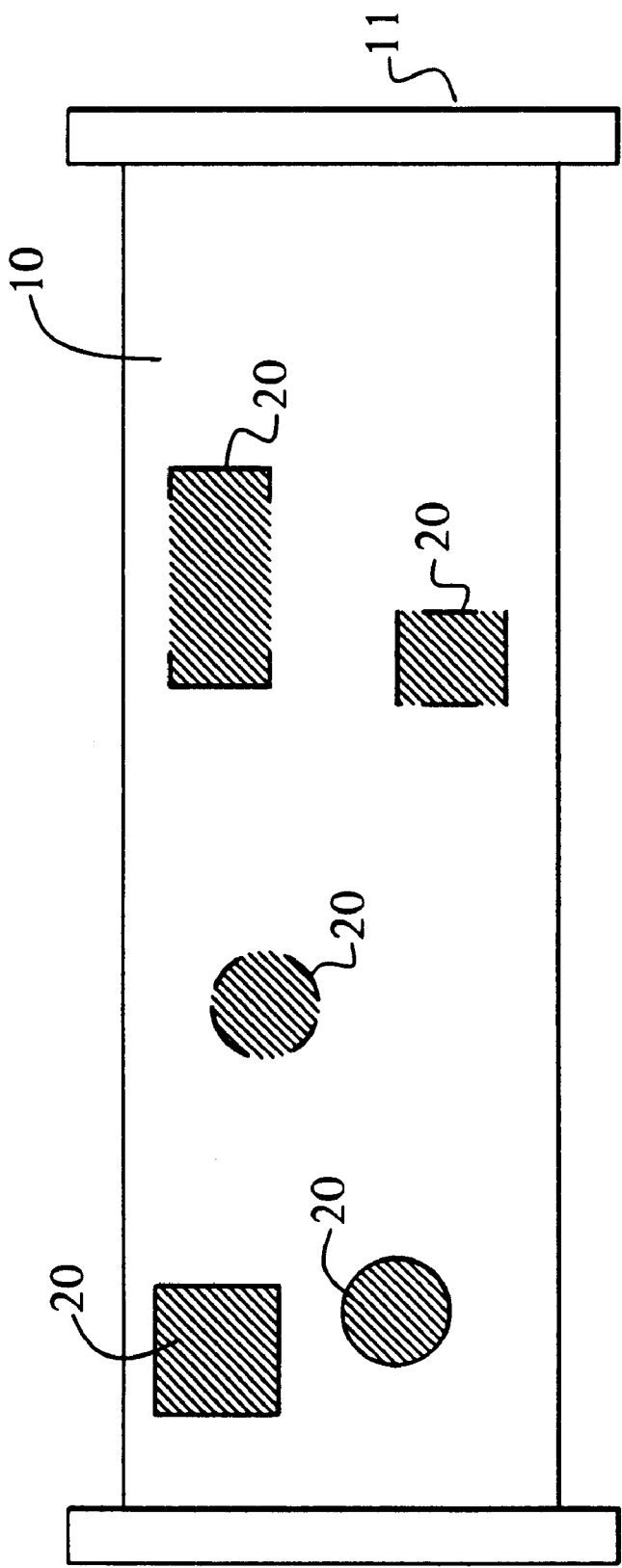
FIG. 9 is a side view of another composite printing elements according to the invention.

As shown in FIGS. 2 and 9, a composite printing elements 11 according to the invention can be formed by mounting photocurable elements 20 on one face of printing element 10 in accordance with the registration information, that is, in the positions indicated by the printed outlines and/or markings. The photocurable elements can be mounted using any of the many means known to those skilled in the art. Preferred mounting means involve applying double-sided adhesive tape or some other suitable adhesive to the printing element, to the photocurable element, or to both. The photocurable elements need not be mounted with any particular degree of precision. All that is required is that photocurable elements be mounted on those portions of the printing element that ultimately will bear relief images.

In accordance with the invention, photocurable elements can cover less than all of the surface area of the printing element upon which they are mounted. Stated differently, the mounted photocurable elements preferably have a cumulative surface area that is less than 100% percent of the surface area of the printing element.

Figure 3:
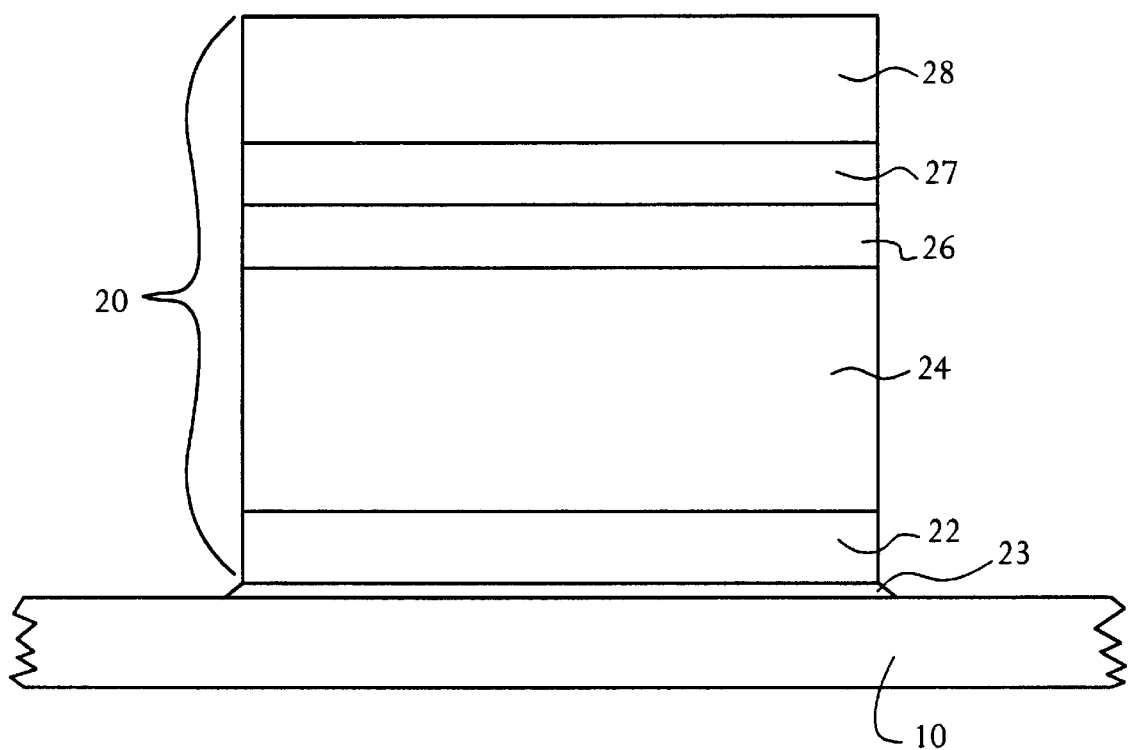
FIG. 3 is a cross-sectional view of a composite printing elements according to the invention.
Figure 10:
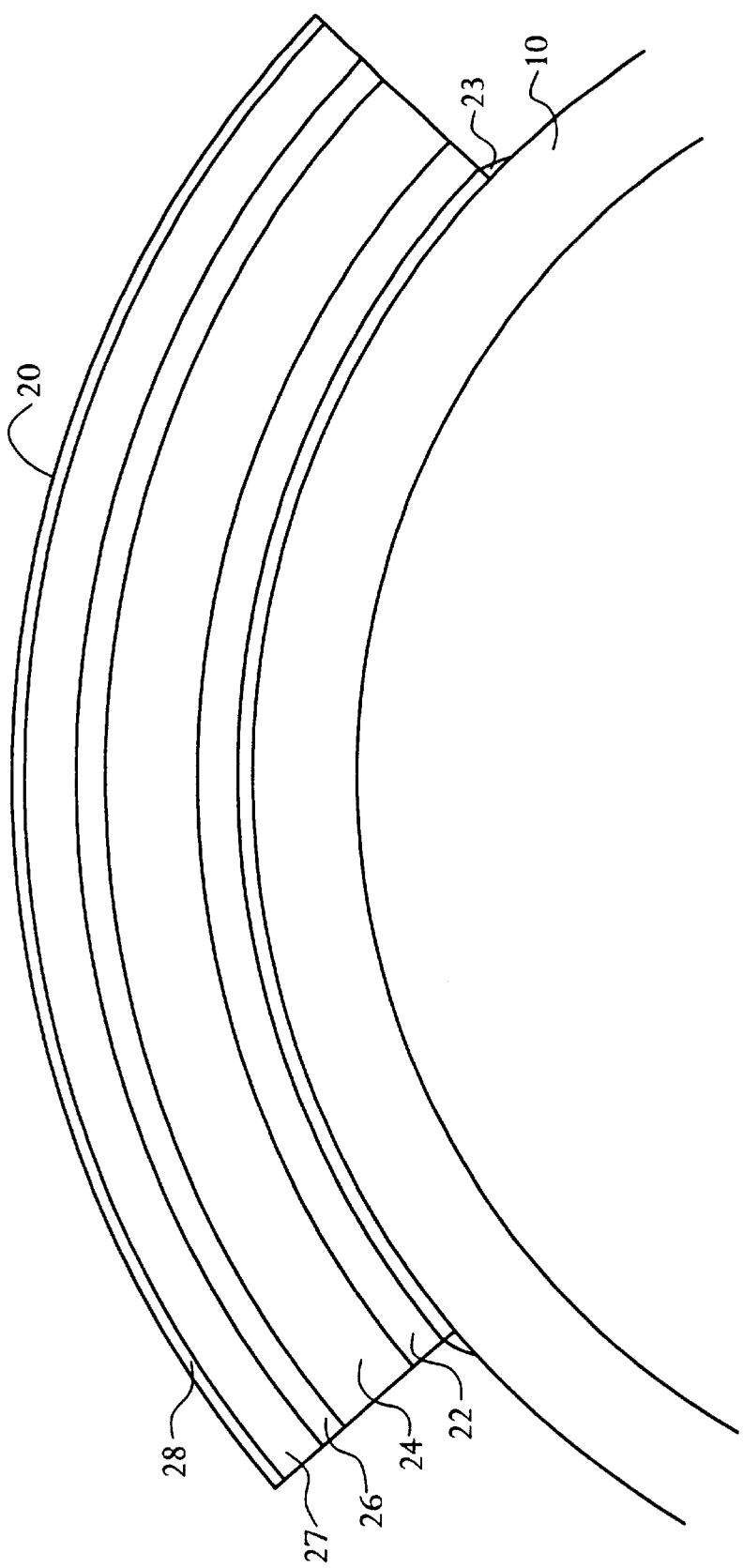
FIG. 10 is a cross-sectional view of a composite printing elements according to the invention.
Figure 11:
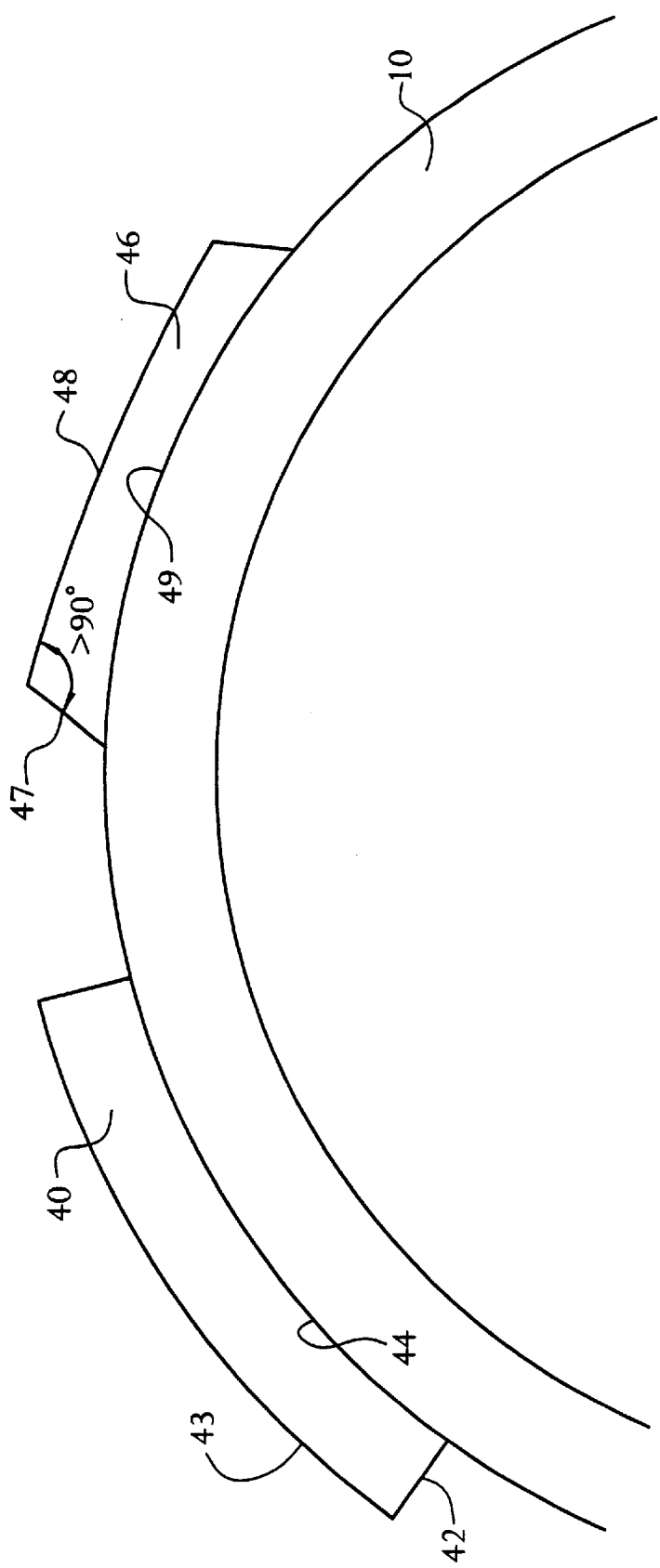
FIG. 11 is a cross-sectional view of a composite printing elements according to the invention.

There are a wide variety of photocurable elements that can be used in accordance with the invention. In preferred embodiments, the elements are solid and vary in thickness from about 0.01 inches to about 0.35 inches and have dimensions up to about 60 inches to about 110 inches. As shown in FIGS. 3 and 10, a preferred photocurable element 20 comprises a support layer 22, one or more photocurable layers 24, 26 and a removable cover sheet 28. Such photocurable elements optionally comprise a transparent protective layer 27 disposed between the cover sheet and the photocurable layer(s). Also shown in FIGS. 3 and 10 is adhesive 23 for mounting element 20 on printing element 10.

Figure 4:
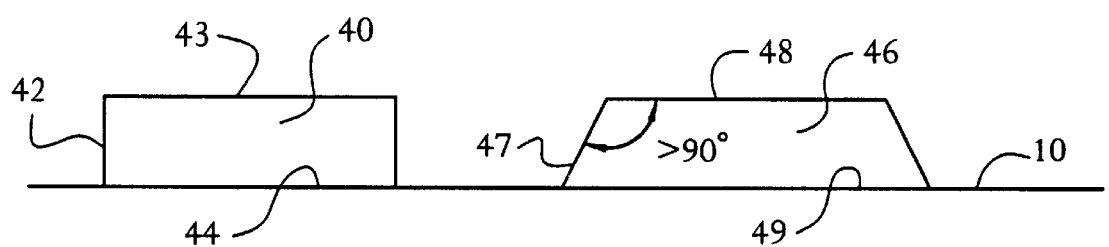
FIG. 4 is a cross-sectional view of a composite printing elements according to the invention.

As shown in FIGS. 4 and 1, photocurable elements (e.g. 40 and 46) have lateral surfaces (i.e., 42 and 47) extending between their respective major faces (i.e., 43 and 44, and 48 and 49). These lateral surfaces preferably meet the upper major faces to form an angle measuring approximately 90° (as with 42 and 43) or greater (as with 47 and 48). It is preferred to apply to lateral surfaces 42 and 47 a tape, ink, pigment, or some other type of material which is substantially opaque to actinic radiation in at least one wavelength region which is effective to cure photocurable material in element 20. Application of such a material is believed to prevent unwanted exposure of the photocurable material to actinic radiation entering through the lateral surface.

The support, or backing, layer of the photocurable element can be formed from a transparent or opaque material such as paper, cellulose film, plastic, or metal. In preferred embodiments, it is a polyethylene terephthalate film having a thickness on the order of 0.005 inches. The support optionally bears an adhesive for more secure attachment to the photocurable layer.

The photocurable layer, which generally has a thickness of from about 0.01 to 0.35 inches, can include a variety of known photopolymers, initiators, reactive diluents, fillers, and dyes. Preferred photocurable materials include an elastomer compound, an ethylenically unsaturated compound having at least one terminal ethylenic group, and a photoinitiator. Exemplary photocurable materials are disclosed in European Patent Applications 0 456 336 A2 (Goss, et al.) and 0 640 878 A1 (Goss, et al.), British Patent No 1,366,769, and U.S. Pat. No. 5,223,375 (Berrier, et al.), U.S. Pat. No. 3,867,153 (MacLahan), U.S. Pat. No. 4,264,705 (Allen), U.S. Pat. No. 4,265,986 (Allen), U.S. Pat. No. 4,323,636 (Chen, et al.), U.S. Pat. No. 4,323,637 (Chen, et al.), U.S. Pat. No. 4,369,246 (Chen, et al.), U.S. Pat. No. 4,423,135 (Chen, et al.), and U.S. Pat. No. 3,265,765 (Holden, et al.), U.S. Pat. No. 4,320,188 (Heinz, et al.), U.S. Pat. No. 4,427,759 (Gruetzmacher, et al.), U.S. Pat. No. 4,460,675 (Gruetzmacher, et al.), U.S. Pat. No. 4,622,088 (Min), and U.S. Pat. No. 5,135,827 (Bolhm, et al.), which are incorporated herein by reference. If a second photocurable layer is used, it typically is disposed upon the first and is similar in composition but considerably thinner, usually less than 0.01 inches.

The photocurable materials of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even, more preferably from about 320 nm to about 380 nm.

The protective layer of the photocurable element, sometimes referred to as the slip film, is disposed upon the photocurable layer(s) and typically is from about 0.001 to about 0.01 inches thick. The protective layer protects the photocurable element from contamination, increases ease of handling, and acts as an ink-accepting layer.

The cover sheet can be formed from plastic or any other removable material that can protect the element from damage until ready for use.

A photocurable element according to the present invention can also have a photoablative mask layer (not shown in FIGS. 2 and 9) adjacent to the photocurable layer for laser-imaging the photocurable element. The photoablative mask layer can be any photoablative mask layer known in the art. Such mask layers include those that can be ablated by any type of laser known to those skilled in the art such as, for example, UV-type Eximer lasers typically operating at wavelengths of about 300 to 400 nm; IR-type lasers such as, for example, $CO_2$ lasers typically operating at a wavelength of about 10,640 nm; Nd-YAG lasers typically operating at a wavelength of about 1064 nm; and diode array lasers typically operating at a wavelength of about 830. Examples of such photoablative mask layers are disclosed in, for example, U.S. Pat. No. 5,925,500 to Yang, et al., herein incorporated by reference, which discloses slip films modified with a UV absorber as the mask layer, thus employing a laser to selectively ablate the modified slip film; and U.S. Pat. No. 5,262,275 to Fan, herein incorporated by reference. The mask layer can have a thickness of from about 2 to about 48 microns.

Representative photocurable elements according to the invention include EPIC®, SPLASH®, FLEXCOR™, and FLEX-LIGHT® CBU brand flexographic printing elements (commercially available from Polyfibron Technologies, Inc., Atlanta, Ga.).

Registration preferably is achieved for composite elements by the computer-controlled transfer of a negative image directly to the outwardly-facing surfaces of the photocurable elements that have been mounted on the printing element.

In one embodiment of the present invention, negative images are preferably transferred by depositing a radiation-blocking material on the photocurable elements' respective surfaces. Following exposure to actinic radiation and further processing, those portions of the element not lying beneath the radiation-blocking material form the relief image.

In preferred embodiments, negative-forming ink is ejected from a printer, such as an ink jet printer, onto the composite element. A wide variety of printers can be used in accordance with the present invention. Suitable printers are those that can print (or be adapted to print) well-defined images on various sizes and shapes of composite elements used in the printing industry. The level of definition (resolution)—typically measured in dots per inch (dpi)—should be as great as possible. The amount of ink delivered by the printers of the invention should be sufficient to absorb at least about 85% of any incident actinic radiation, preferably about 90% of such radiation, more preferably about 95%, and even more preferably 99.9% of such radiation. Preferred printers are those that are able to deliver a fully radiation-absorptive amount of ink in a single printing, although with some printers (and with some inks) multiple printings may be necessary to deliver a radiation-absorptive amount.

Ink jet printers are particularly preferred for forming a negative image. Ink jet printing is performed by discharging ink droplets from a print head to a substrate. The droplets typically are ejected through orifices or nozzles in the print head and are directed to the substrate to form an image thereon. In contrast to many other types of printing, there usually is no contact between the printer and the substrate with ink jet printing. Virtually any ink jet printer can be used in accordance with the present invention, so long as it has both a print head and some means for controlling and/or directing the ejection of ink therefrom. Similarly, virtually any print head known in the art can be employed, so long as it comprises at least one nozzle which ejects ink droplets in response to control signals.

An ink according to present invention is any liquid or solid moiety that is both substantially opaque to actinic radiation in at least one wavelength region effective to cure the above-described photocurable elements and substantially resistant to polymerization upon exposure to actinic radiation in that wavelength region. Substantially opaque inks are those that can absorb at least about 85% of any incident actinic radiation, preferably about 90% of such radiation, more preferably about 95%, and even more preferably 99.9% of such radiation. It will be recognized that a substantially opaque ink need not be substantially opaque in all amounts and at all possible concentrations, so long as it can be deposited upon a substrate in sufficient quantity so as to be substantially opaque. Inks are substantially resistant to polymerization in accordance with the invention so long as they can be removed from the surface of elements to which they are applied (preferably using conventional element-washing techniques) without damaging the relief surface, and so long as they do not react with or otherwise alter the chemical and/or physical properties of the element to such an extent that their removal damages the relief surface. Preferred inks include one or more radiation-absorptive molecules dissolved in solvent, preferably at concentrations of about 3 to about 20 weight percent. Particularly preferred inks are the U-26, U-53M, Black 4D, and Jolt brands (Dataproducts Corporation) and those formed by mixing Crown Super Marking Stamping Ink (Fulton Marking Equipment Company, Warminster, Pa.) and UVINUL 3050 brand 2,2',4,4'-tetrahydroxybenzophenone (BASF, Ludwigshaven, Germany) in a solvent selected from methanol, isopropanol, n-butanol, chloroform, methyl ethyl ketone, propylene glycol monomethyl ether, dipropylene glycol monomethyl ether, diethylene glycol ethyl ether, and mixtures thereof. Other useful ink ingredients include the Tinopal SPF and Joncryl 68 products, which are commercially available from Ciba-Geigy Corp., Hawthorn, N.Y., and S. C. Johnson Company, Milwaukee, Wis., respectively.

In another embodiment of the present invention, a negative image is transferred by laser ablating the photoablative mask layer on the photocurable elements' respective surfaces. When the solid photocurable printing element is used, a laser is employed to selectively ablate, or remove, the photoablative mask layer such that the areas where the photoablative mask layer was ablated will cure, or harden, upon exposure to the UV light and the areas where the photoablative mask layer was not ablated will remain uncured. Following front exposure of the exposed areas of the photopolymer, uncured photopolymer, i.e., the photopolymer under the areas of the photoablative layer that were not laser-ablated, is removed from the mounted photocurable elements, typically by washing the elements with (and/or in) an organic and/or aqueous solvent in which the photocurable material is at least somewhat soluble. This solvent wash step typically is accompanied or preceded by brushing, wiping, or some other mild, non-destructive abrasion of the elements. Useful washing devices include those commercially available from Polyfibron Technologies and Anderson & Vreeland.

Figure 5:
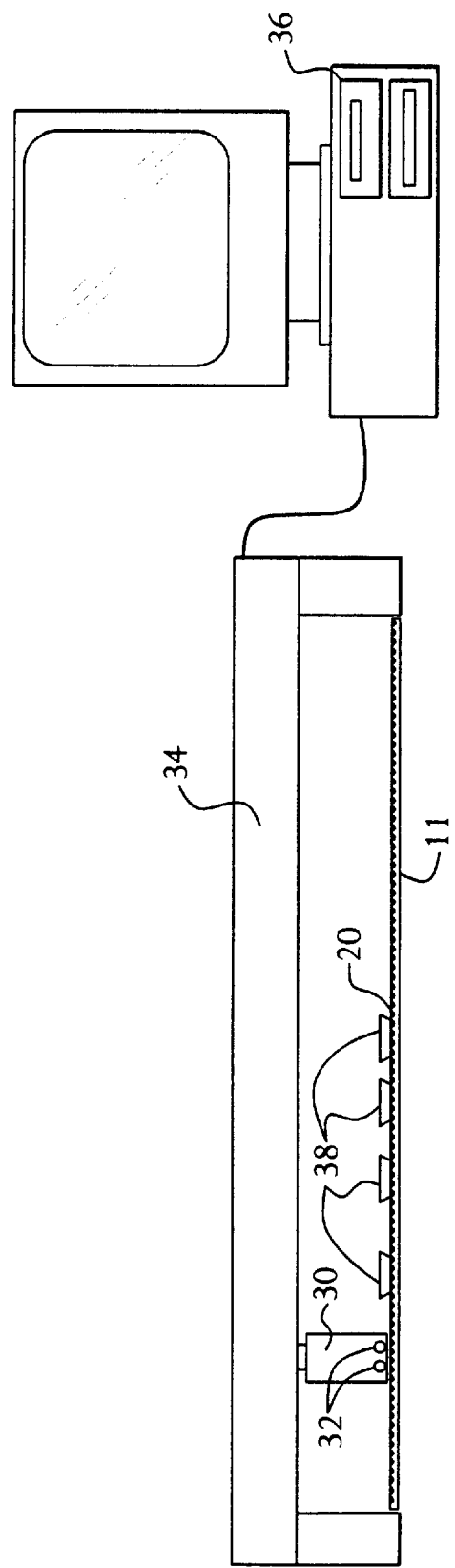
FIG. 5 is a plan view of a printing apparatus for composite printing elements.

FIG. 5 shows representative printing apparatus according to one embodiment of the present invention is shown comprising a print head 30 having a plurality of nozzles 32 and control means 34 and 36 electrically coupled with the print head. A particularly preferred printing apparatus is the BOXCOR™ system, which is commercially available from Polyfibron Technologies, Atlanta, Ga. The BOXCOR™ system can be used for both approximate registration and registration by application of a computer-generated negative image to the composite printing element. In another embodiment of the present invention, registration by application of a computer generated negative image to the composite printing element can be accomplished by laser-ablation of a photoablative mask layer on the photocurable element with a laser such that the areas where the photoablative mask layer was ablated will cure, or harden, upon exposure to the UV light and the areas where the photoablative mask layer was not ablated will remain uncured. Preferred laser systems include, for example, the Creo THERMOFLEX (Creo Products, Burnaby, British Columbia) or the Barco CDI (Barco Graphics, Vandalia, Ohio).

Figure 7:
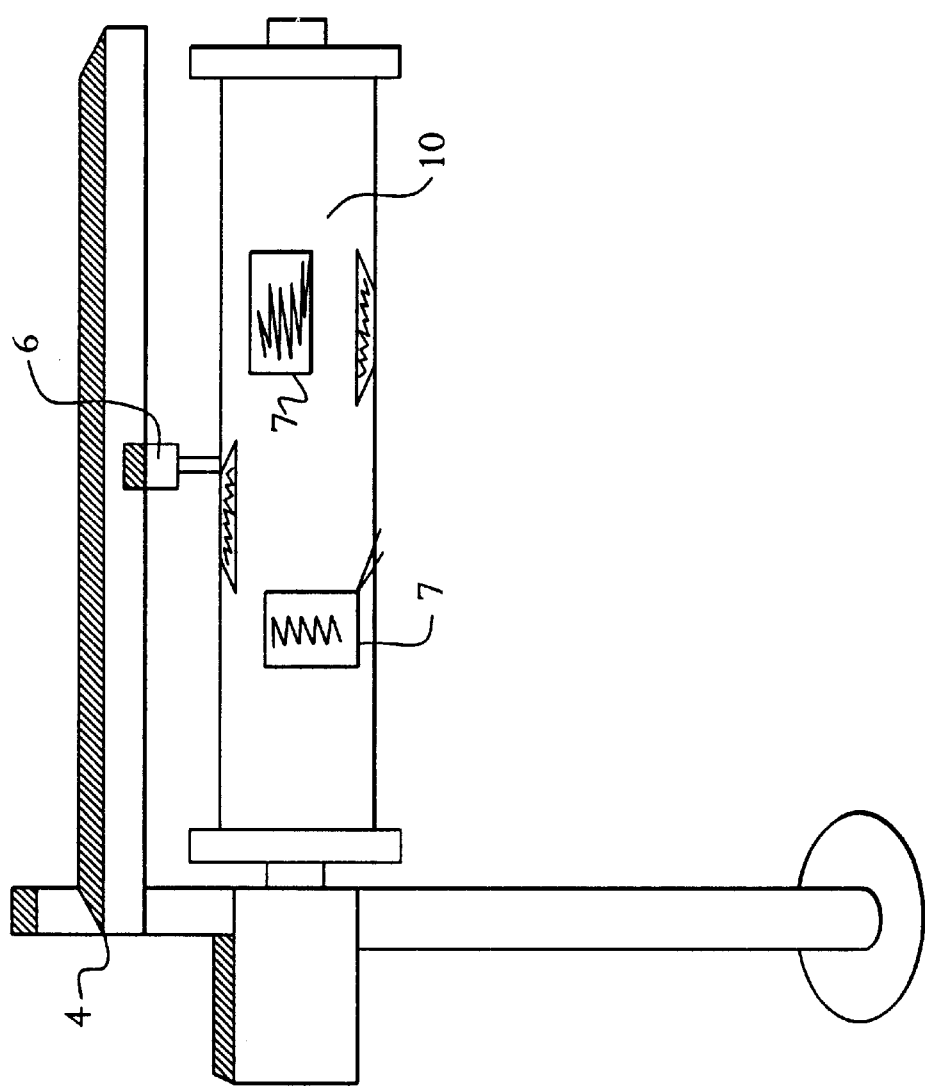
FIG. 7 is a plan view of another printing apparatus for composite printing elements.
Figure 7:
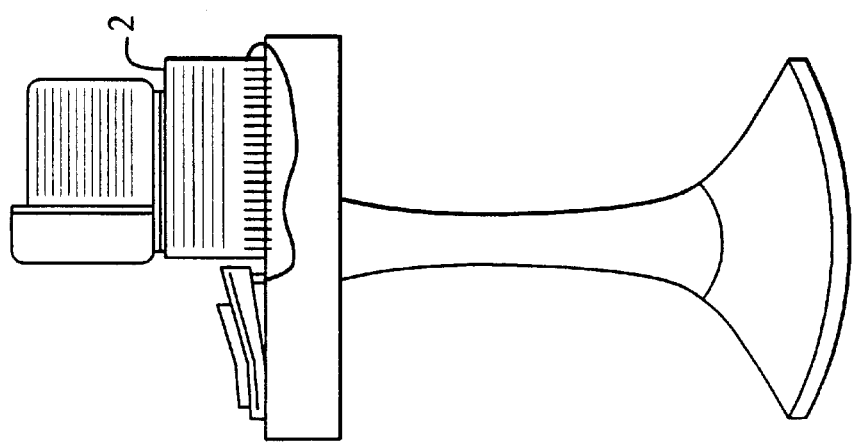
Figure 12:
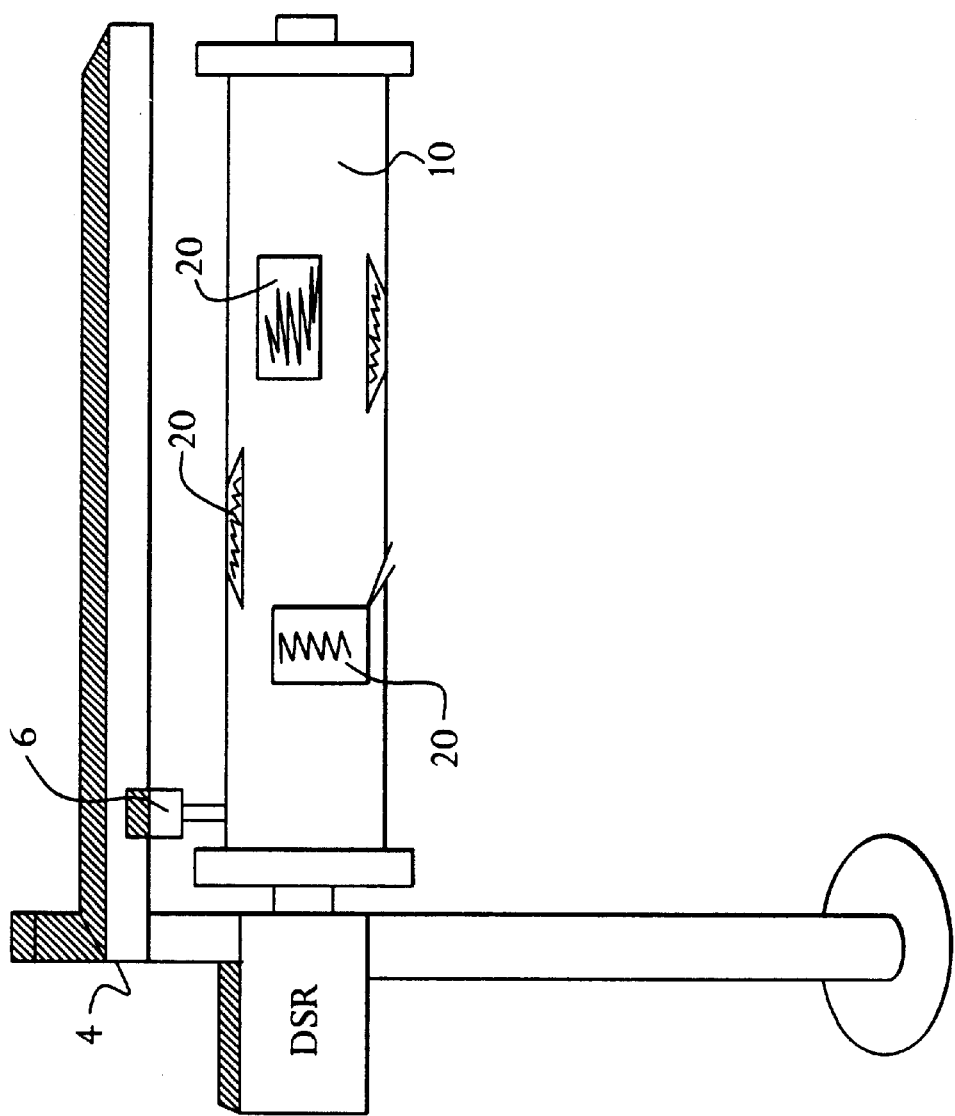
FIGS. 12–13 are operational plan views of the printing apparatus of FIG. 7.
Figure 12:
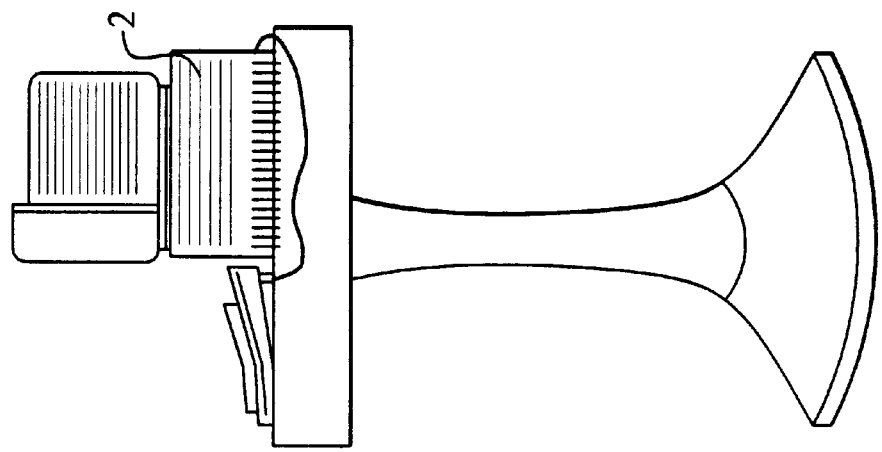
Figure 13:
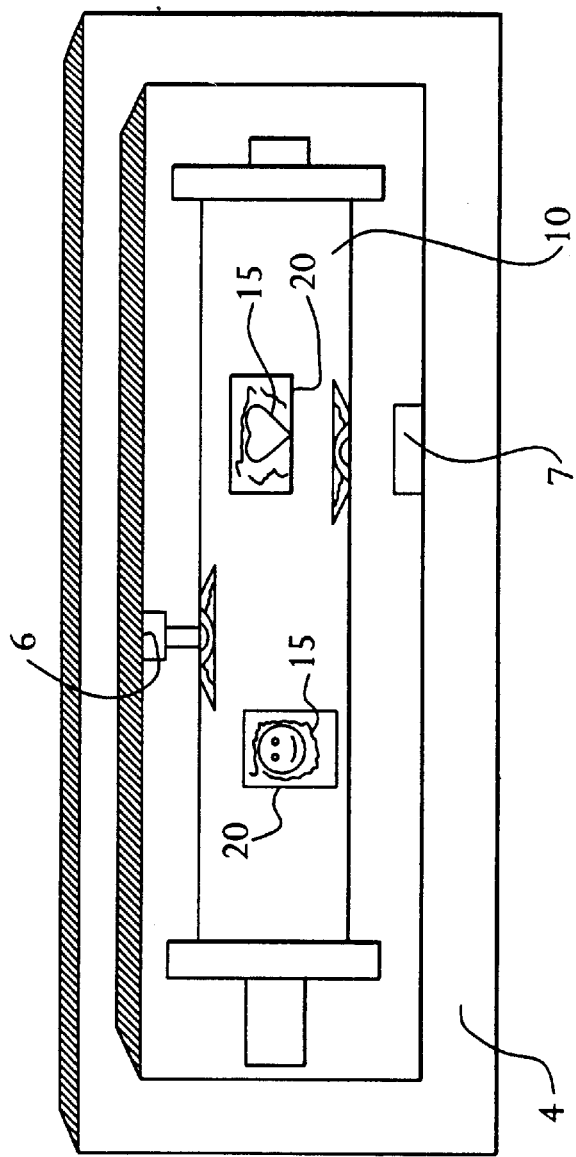
Figure 13:
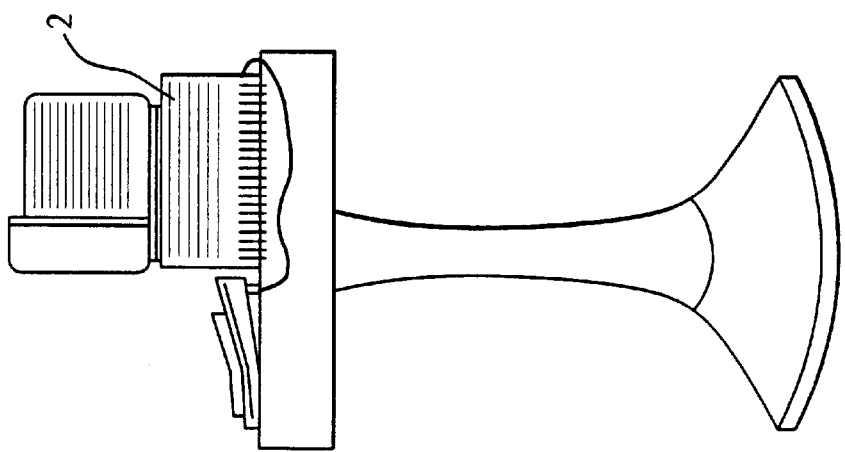

FIG. 7 illustrates a preferred printing apparatus according to another embodiment of the present invention. In FIG. 7, the preferred printing apparatus is a computerized Digital Sleeve Register System (DSRS) that includes control means 2 and 4 electrically coupled to a printhead 6. An example of a preferred DSRS is the MAX 4000 Mask Engraver commercially available from Stork STK Schablonentechnik (Schaftenau, Austria). Registration for substantially arcuate composite elements via a DSRS is shown with reference to FIGS. 12–14. FIG. 12 shows a typical DSRS as illustrated in FIG. 7, having photocurable elements 20 mounted on the cylindrical printing element 10 in accordance with the transferred registration information. Registration via the DSRS is preferably achieved by the computer-controlled transfer of a negative image directly to the outwardly-facing surfaces of at least two photocurable elements 20 that have been mounted on the cylindrical printing element 10. Referring now to FIGS. 12 and 13, such negative images 15 preferably are transferred by depositing a radiation-blocking material on the photocurable elements' respective surfaces via printhead 6. In another embodiment of the present invention, negative images 15 are transferred by laser-ablating a photoablative mask layer with laser 7 (FIG. 13) such that the areas where the photoablative mask layer was ablated will cure, or harden, upon exposure to the UV light and the areas where the photoablative mask layer was not ablated will remain uncured. Preferred laser systems include, for example, the Creo THERMOFLEX (Creo Products, Burnaby, British Columbia) or the Barco CDI (Barco Graphics, Vandalia, Ohio).

Figure 14:
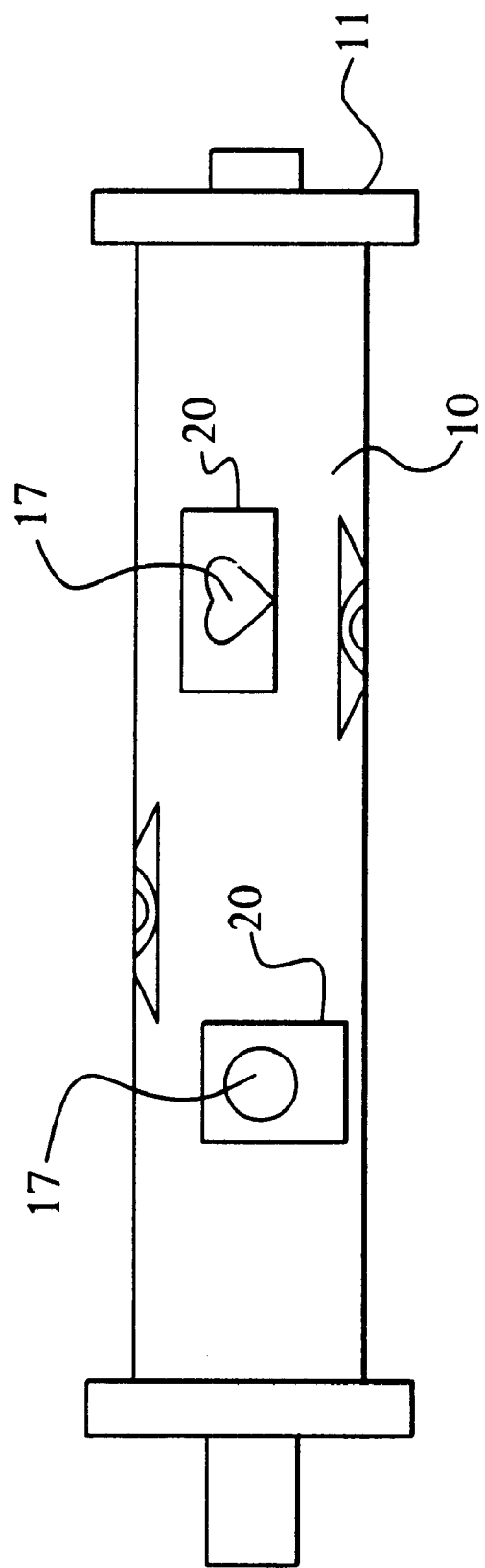
FIG. 14 is a side view of a composite printing elements according to the invention.

Referring to FIG. 14, a composite element 11 is shown. Following exposure to actinic radiation and further processing, those portions of the photocurable element 20 exposed to actinic radiation form the relief image 17.

The control means for a printing apparatus according to the present invention can be any of those known in the art to be capable of controlling placement of the print head 6 or laser 7 relative the printing substrate. Control means amenable to the practice of this invention include computing devices such as microprocessors, microcontrollers, capacitors, switches, circuits, logic gates, or equivalent logic devices. Representative control means include a personal computer coupled to a print head driver board or a laser head/array. Representative software packages include Adobe PHOTOSHOP and Adobe ILLUSTRATOR, both of which are commercially available from Adobe Systems, Inc. (San Jose, Calif.). Representative ink jet printers include those manufactured by Spectra Incorporated, Dataproducts Corporation (Woodland Hills, Calif.), Jarfalla (Sweden), Encad (San Diego, Calif.), AlphaMerics (Simi Valley, Calif.), Videojet (Wood Dale, Ill.), particularly the Epson Stylus (Epson Corporation, Torrance, Calif.), HP 600c, HP 650c, HP 855c, and HP 750c ink jet printers (Hewlett-Packard Corp., Palo Alto, Calif.). The Raster Image Processor includes that commercially available from Alan Graphics (Peekskill, N.Y.) and PCC Artworks (Bristol, Pa.).

The methods of the invention involve the transfer of a negative image to the surface of photocurable elements without use of phototools. This typically is accomplished by removing the cover sheet from mounted, commercially-available photocurable elements and then transferring the negative image on the surfaces exposed by removal of the cover sheets.

Because the photocurable elements are not initially placed on the printing element in precise register, it generally is preferred print a "bleed" or "border" area around the periphery of each element along with the negative image. This border typically begins at the intended outer limit of the element and extends in an outward manner for some selected distance corresponding to the level of imprecision with which the photocurable elements were placed on the printing element. Those skilled in the art will recognize that the use of a sufficiently large border should prevent the curing of outwardly lying photocurable material other than that intended to be cured in accordance with the negative image.

After the negative image has been transferred as described above to the photocurable printing element, it (and, hence, at least a portion of the composite element) is exposed to actinic radiation, preferably UV light, in a suitable wavelength region. There are many devices that can be used to perform this so-called "front" exposure of the photocurable elements, including FLEX-LIGHT® brand UV modules (Polyfibron Technologies, Inc.), as well as those manufactured by Anderson & Vreeland (Bryan, Ohio) and Photomeca (Pompeii, France). For certain applications, it may be desirable to combine the printing and exposing and/or laser-ablation functions in a single device. It also may be desirable to "back" expose the photocurable elements by exposing the support layers thereof elements to actinic radiation for a time and under conditions effective to cure a portion of the photocurable material in the region adjacent the support. This back exposure can be performed after the mounting step (provided that the printing element and the mounting means are sufficiently transparent to actinic radiation), but more preferably is performed before the photocurable elements have been mounted.

Following front exposure of the negative image to actinic radiation, uncured photopolymer is removed from the mounted photocurable elements, typically by washing the elements with (and/or in) an organic and/or aqueous solvent in which the photocurable material is at least somewhat soluble. This solvent wash step typically is accompanied or preceded by brushing, wiping, or some other mild, non-destructive abrasion of the elements. Useful washing devices include those commercially available from Polyfibron Technologies, Anderson & Vreeland, and Photomeca.

Additional objects, advantages, and novel features of this invention will become apparent to those skilled in the art upon examination of the following examples thereof, which are not intended to be limiting.

EXAMPLE 1

A 36"×38" polyvinyl chloride carrier sheet having thickness of 30 mils was cut from a roll and was placed in an AlphaMerics SPECTRUM® brand ink jet plotter. Dimensional outlines of photocurable elements to be mounted on the carrier sheet were generated from a computer-stored electronic image using Adobe ILLUSTRATOR brand software in conjunction with the PCC Artworks Rastor Image Processor. The outlines were drawn on the carrier sheet in approximate register using the plotter and conventional inks.

FLEXCOR™ 155 photocurable elements of the respective dimensions were cut and back exposed for 45 seconds on a FLEX-LIGHT® brand model 5280 exposure unit (Polyfibron Technologies, Inc.). These elements then were mounted on the carrier sheet on the respective dimensional outlines. Mounting of the elements on the carrier sheet was accomplished using a double-sided adhesive tape.

Coversheets were removed from the mounted elements and the composite element was placed in the plotter in accordance with the respective registration markings. A stored negative image was sent to the plotter from the a computer and was printed onto the element at 600 DPI using U-53M brand ink. The thickness of the ink laid down (approximately 1 mil) from a 50 $\mu$m orifice head was sufficient to block about 87% of the UV light used during subsequent curing. The software allowed printing of the negative image only in those areas which had the mounted elements. Very accurate registration was accomplished by the computer driving the ink-jet plotter.

The carrier bearing the mounted, imaged photocurable elements then was UV flood exposed in the FLEX-LIGHT® brand exposure unit for 15 minutes. The composite element then was processed by applying a continuous supply of SOLVIT™ brand solvent (Polyfibron Technologies, Inc.) while brushing uncured polymer from the element in a FLEX-LIGHT® brand Processor 5280, Serial No. 017 in-line processor for 12 minutes. The double-sided adhesive tape resisted the solvent during the processing. The carrier was dried and post-exposed in a FLEX-LIGHT® brand Dryer 5280, Serial No. 017 dryer and finishing unit.

Carriers bearing negatively imaged elements then are mounted on a 36" circumference drum, the elements already being in register. Conventional printing ink is applied to the negative relief surface, and the surface is contacted with a sheet of paper to produce a high quality positive image.

EXAMPLE 2

A VERSAFLEX® brand plate mounting sleeve from Axcyl Inc. (Vancouver, Wash.) composed of fiber reinforced epoxy resin, having a width of 60 inches and a circumference of 42 inches and a thickness of 0.030 inches was mounted on the mandrel support bar of a MAX 4000 Mask Engraver (Stork STK, Schaftenau, Austria). Dimensional outlines (i.e., templates) of photocurable elements to be mounted on the sleeve were generated from a computer-stored electronic image created using ADOBE ILLUSTRATOR® brand software, and processed by a PCC® brand raster image processor. The dimensional outlines were then plotted upon the surface of the plate mounting sleeve in exact and relevant position to graphics layout created with ADOBE ILLUSTRATOR® brand software.

FLEX-LIGHT® CBU brand photocurable elements (flexographic photopolymer printing elements) from Polyfibron Technologies, Inc., Atlanta, Ga., of the respective dimensions were cut and back exposed for 20 seconds on a FLEX-LIGHT® brand model 5280 exposure unit (Polyfibron Technologies, Inc., Atlanta, Ga.). Coversheets were then removed from the photocurable elements. These elements then were mounted within the respective templates. Mounting of the elements on the sleeve was accomplished using FLEXSTICK TAPE, a double-sided adhesive tape commercially available from Adheso Graphics Co. (Westburry, N.Y.).

The sleeve with the FLEX-LIGHT® CBU photocurable elements adhered to it in position and dimensional relation to computer drawn dimensional outlines was then placed in a Creo THERMOFLEX® brand computer-to-element laser imaging device. A stored image was sent to the laser imaging device from a computer and was subsequently ablated into the carbon black laser sensitive coating of the photocurable elements with 830 nm IR laser light generated by diode array emitters. Areas of the photocurable elements that were not imaged by the laser remained opaque to UV light used during subsequent curing. The Creo THERMOFLEX-controlled software directed laser ablation of the carbon black coating only in those areas which had the mounted elements. Very accurate registration was accomplished by the computer driving the laser emitter.

The sleeve bearing the mounted, imaged photocurable elements then was UV flood exposed in the FLEX-LIGHT® brand model 60A sleeve exposure unit for 10 minutes. The composite elements on the sleeve were then processed by applying a continuous supply of SOLVIT® brand solvent (Polyfibron Technologies, Inc.) while brushing uncured polymer from the elements in a FLEX-LIGHT® brand model 60A sleeve washout unit for 8 minutes. The double sided adhesive tape resisted the solvent during the processing. The sleeve with mounted elements on it was dried and post-exposed in a FLEX-LIGHT® brand model 60A sleeve dryer/finisher unit.

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A method for preparing a composite printing element, comprising the steps of:

transferring registration information to an outer face of a printing element;

disposing a first face of at least one solid photocurable element comprising photocurable material and having first and second opposing major faces of defined surface area upon said printing element in accordance with said registration information transferred to said printing element, wherein a photoablatable mask layer is disposed upon said second opposing major face of said solid photocurable element; and transferring graphic data to said second opposing major face of said solid photocurable element by photoablating said photoablatable mask layer with a laser, thereby providing ablated and unablated areas forming an image, said ablated areas exposing said second opposing major face of said solid photocurable element.

2. The method of claim 1 further comprising the steps of:

exposing said ablated areas of said solid photocurable element to actinic radiation effective to cure said exposed photocurable material within said photocurable element; and removing uncured photocurable material under said unablated areas of said photoablatable mask layer from said element.

3. The method of claim 1 wherein said photocurable material is disposed upon a support layer.

4. The method of claim 1 wherein said photocurable material comprises an elastomer compound, an ethylenically unsaturated compound having at least one terminal ethylenic group, and a photoinitiator.

5. The method of claim 1 wherein said photocurable element is disposed upon said printing element through use of an adhesive.

6. The method of claim 1 wherein said registration information is transferred by disposing a visually perceptible material on said first face of said printing element.

7. The method of claim 1 wherein said visually perceptible material is disposed using an ink jet printer.

8. The method of claim 1 wherein said registration information is transferred by scoring said first face of said printing element.

9. A method for preparing a composite printing elements, comprising the steps of:

transferring registration information to an outer face of a substantially arcuate printing element;

disposing a first face of at least one solid photocurable element comprising photocurable material having first and second opposing major faces of defined surface area upon said substantially arcuate printing element in accordance with said registration information transferred to said substantially arcuate printing element; and transferring graphic data to said second opposing major face of said solid photocurable element.

10. The method of claim 9 wherein said second face of said solid photocurable element is a photoablatable mask layer.

11. The method of claim 10 wherein said transferring graphic data step comprises photoablating said photoablatable mask layer with a laser, thereby providing ablated and unablated areas forming an image, said ablated areas exposing said second opposing major face of said solid photocurable element.

12. The method of claim 11 further comprising the steps of:

exposing said ablated areas of said solid photocurable element to actinic radiation effective to cure said exposed photocurable material within said photocurable element; and removing uncured photocurable material under said unablated areas of said photoablatable mask layer from said element.

13. The method of claim 9 wherein said transferring graphic data step comprises ejecting a negative-forming ink from an ink jet print head onto said second face of said solid photocurable element thereby providing a negative image, said ink being substantially opaque to actinic radiation in at least one wavelength region effective to cure photocurable material within said element and substantially resistant to polymerization upon exposure to actinic radiation in said wavelength region.

14. The method of claim 13 further comprising the steps of:
   exposing said negative image to actinic radiation effective to cure said exposed photocurable material within said photocurable element; and
   removing uncured solid photocurable material and said unablated areas of said photoablatable mask layer from said element.

15. The method of claims 11 or 13 wherein said second face of said photocurable element is a layer of photocurable material.

16. The method of claim 12 wherein said second face of said photocurable element is a transparent protective layer disposed upon a layer of photocurable material.

17. The method of claims 11 or 13 wherein said photocurable material is disposed upon a support layer.

18. The method of claims 11 or 13 wherein said photocurable material comprises an elastomer compound, an ethylenically unsaturated compound having at least one terminal ethylenic group, and a photoinitiator.

19. The method of claims 11 or 13 wherein said element is disposed upon said substantially arcuate printing element through use of an adhesive.

20. The method of claim 13 wherein said wavelength region is from about 300 to about 400 nm.

21. The method of claim 13 wherein said ink is ejected from said print head by actuating control means electrically coupled with said print head.

22. The method of claim 11 or 13 wherein said registration information is transferred by disposing a visually perceptible material on said outer surface of said substantially arcuate printing element.

23. The method of claims 11 or 13 wherein said registration information is transferred by scoring said first face of said printing element.

24. The method of claims 11 or 13 wherein said registration information is transferred by shining light on said first face of said substantially arcuate printing element.

25. The method of claims 11 or 13 wherein the substantially arcuate printing element has inner and outer opposing major faces of defined surface area, said outer opposing major face having a greater surface area than said inner opposing major face.

26. The method of claims 11 or 13 wherein said registration information comprises an image corresponding to an outline of at least one photocurable element.

27. The method of claim 26 wherein said registration information comprises a rectilinear image having a shape corresponding to said outline.

28. The method of claim 26 wherein said registration information comprises an elliptical image having a shape corresponding to said outline.

29. The method of claims 11 or 13 wherein said registration information comprises an image corresponding to a portion of an outline of at least one photocurable element.

* * * * *